(12) United States Patent
Machida et al.

(10) Patent No.: US 7,291,891 B2
(45) Date of Patent: Nov. 6, 2007

(54) IN-SOLID NUCLEAR SPIN QUANTUM CALCULATION DEVICE

(75) Inventors: Tomoki Machida, Kanagawa (JP); Susumu Komiyama, Tokyo (JP); Tomoyuki Yamazaki, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 164 days.

(21) Appl. No.: 10/497,244

(22) PCT Filed: Dec. 5, 2002

(86) PCT No.: PCT/JP02/12779

§ 371 (c)(1),
(2), (4) Date: Jun. 2, 2004

(87) PCT Pub. No.: WO03/049197

PCT Pub. Date: Jun. 12, 2003

(65) Prior Publication Data

US 2005/0021927 A1    Jan. 27, 2005

(30) Foreign Application Priority Data

Dec. 6, 2001  (JP) .............................. 2001-373146

(51) Int. Cl.
*H01L 29/06* (2006.01)
*G01R 33/02* (2006.01)

(52) U.S. Cl. .......................... 257/421; 257/14; 257/24; 257/E27.005; 257/E33.063; 257/E21.034; 257/410; 257/411; 712/32; 505/170; 324/225

(58) Field of Classification Search ................. 257/421, 257/422, 423, 424, 425, 426, 427, 194, 14, 257/24, 663
See application file for complete search history.

(56) References Cited

U.S. PATENT DOCUMENTS 5,332,911 A * 7/1994 von Klitzing et al. ...... 257/187

(Continued)

FOREIGN PATENT DOCUMENTS

WO        WO 99/14858        3/1999

OTHER PUBLICATIONS

B. E. Kane; Nature, vol. 393, pp. 133-137, May 14, 1998. Cited in the PCT search report.
Tomoki Machida et al.; Elsevier, Physics B., vol. 298, issue 1-4, pp. 101-105, 2001. Cited in the PCT search report.

(Continued)

*Primary Examiner*—Sue A. Purvis
*Assistant Examiner*—Fazli Erdem
(74) *Attorney, Agent, or Firm*—Westerman, Hattori, Daniels & Adrian, LLP.

(57) ABSTRACT

A voltage is applied across gate electrodes (103A) and (103B) in a two-dimensional electronic system (101) placed under a magnetic field, and the polarity of an electric current passed between ohmic electrodes (102D) and (102S) is selected to bring about inversion of electron spins based on a non-equilibrium distribution of electrons in a quantum Hall edge state and to initialize the polarization of nuclear spins. An oscillatory electric field of a nuclear magnetic resonance frequency is applied to coplanar waveguides (104A) and (104B) to control the nuclear spin polarization. The controlled spin polarization is read out by measuring the Hall resistance from ohmic electrodes (102VA) and (102VB). An in-solid nuclear spin quantum processor device can be manufactured by attaching a microfine metal gate structure to a quantized Hall effect element that is realized in a semiconductor two-dimensional system, and allows a limited number of nuclear spins to be controlled, initialized, subjected to a unitary transformation, and read out.

10 Claims, 7 Drawing Sheets

U.S. PATENT DOCUMENTS

| | | |
|---|---|---|
| 5,888,588 A | 3/1999 | Nagabushnam et al. |
| 6,096,641 A | 8/2000 | Kunikiyo |
| 6,162,715 A | 12/2000 | Mak et al. |
| 6,274,484 B1 | 8/2001 | Tsai et al. |
| 6,340,629 B1 | 1/2002 | Yeo et al. |
| 6,403,999 B1 * | 6/2002 | O'Handley et al. ......... 257/295 |

OTHER PUBLICATIONS

T. Machida et al.; PERGAMON, Solid-State Electronics, vol. 42, No. 7-8, pp. 1155-1158; 1998. Cited in the PCT search report.

T. Machida et al.; Applied Physics Letters, vol. 80, No. 22, pp. 4178-4180, Jun. 3, 2002. Cited in the PCT search report.

* cited by examiner

IN-SOLID NUCLEAR SPIN QUANTUM CALCULATION DEVICE

TECHNICAL FIELD

The present invention relates to a quantum processor device utilizing a nuclear spin system in solid for use in a quantum computer.

BACKGROUND ART

The quantum computer is a computer that is overwhelmingly high in the speed of computation in solving those specific problems which are virtually impossible to compute with classical computers. It uses units in a quantum two level system called quantum bits corresponding to bits used in the classical computer. While the quantum computer uses a large number of quantum bits in computation, it is basically operated by a quantum processor device that performs unitary transformation for any given quantum bit and reads out the quantum bit after the transformation.

An explanation is given of basic particulars by taking a spin as an example. In general, applying a static magnetic field to a spin having a quantum number of ½ allows the spin to take one of two states that it is oriented parallel (upwards) and anti-parallel (downwards) to the applied static magnetic field, namely |0> or |1>, or further a state that it is inclined to the magnetic field. This latter state is a state of superposition of the upward state |0> and the downward state |1> and is described by equation (1) as follows:

$$|s\rangle = \alpha|0\rangle + \beta|1\rangle \quad (1)$$

where $\alpha$ and $\beta$ are complex numbers which satisfy equation (2) as follows:

$$|\alpha|^2 + |\beta|^2 = 1 \quad (2)$$

With the spin orientation measured, the state |s> brings about a change called "convergence of wave packet" to become either the state |0> or the state |1>. Then, the probabilities that the result of measurement is the state |0> and the state |1> are given as $|\alpha|^2$ and $|\beta|^2$, respectively. Innumerable states are possible which even if they give an identical probability in their measurement result, namely the $|\alpha|^2$ or $|\beta|^2$ that is identical, are different in $\alpha$ or $\beta$, and they are distinguished from one another by their "phases".

A state of superposition given by equation (1) functions as a quantum bit. To wit, while the classical bit is simply either 0 or 1 state, the quantum bit is not simply either state |0>($|\alpha|^2=1$, $|\beta|^2=0$) or state |1>($|\alpha|^2=0$, $|\beta|^2=1$). In addition to these two states (|0> and |1>), there exist innumerable states |s> intermediate between them (in which neither $|\alpha|^2$ nor $|\beta|^2$ is 1 or 0) and further innumerable states |s'> also varying in phase. Changing or transforming one state |s> to another state |s'> by some operation is called unitary transformation.

In general, constructing a quantum computer requires providing it with four functions as follows: First is initialization. That is, a mean must be provided that initializes the initial state of a quantum bit to a well defined state, e.g., to |0> or |1>.

Second is a means for controlling the state (quantum processing gate). That is, a means must be provided for the unitary transformation of a prepared initial state (e.g., |0> or |1>) to any state of superposition |s> as desired. This latently includes the requirement that the spin state may not be disturbed and the phase may not be lost (made decoherent) affected by the environment.

Third is: read-out. That is, a means must be provided that measures a state |s> after the unitary transformation, or determines the value of a $|\alpha|^2$ or $|\beta|^2$.

Fourth is expandability. In the first place is there required a conditional state control (controlled not gate) for two bits, which must then be expanded by integration for a number of quantum bits.

The present invention contemplates providing a quantum processor device equipped with the first to third of the four functions above. Thus, quantum processor devices according to the present invention when used do not immediately allow making up a quantum computer, but they are components necessary and essential in the makeup of such a quantum computer.

Mention is next made of basic particulars about a method of the unitary transformation of one bit. If a nuclear spin is used to serve as a quantum bit, then its polarization (orientation) is designated as a state |s> in equation (1). To wit, if it is oriented upwards, the $|\alpha|^2=1$ and $|\beta|^2=0$ in equation (1). If it is oriented downwards, the $|\alpha|^2=0$ and $|\beta|^2=1$ in equation (1). A polarized state in which the spin is inclined is defined by designating $\alpha$ and $\beta$ having values other than them. Energy $E_0$ of state |0> that is parallel to magnetic field is lower than energy $E_1$ of state |1> that is antiparallel to magnetic field. Frequency f that is equal (or proportional) to difference between energy $E_1$ and energy $E_0$ as follows:

$$hf = E_1 - E_0 \quad (3)$$

where h is Planck's constant is referred to as NMR (Nuclear Magnetic Resonance) frequency. If the initial state is |0>, applying an oscillating magnetic field having a NMR frequency to a static magnetic field perpendicularly thereto causes the spin state to be unitary-transformed in general with time t and its evolution with time is expressed as $\alpha$ and $\beta$ in equation (1) changing with time as shown by equations (4) and (5) below, $$|\alpha(t)|^2 = \cos^2(2\pi F \Delta t) \quad (4)$$

$$|\beta(t)|^2 = \sin^2(2\pi F \Delta t) \quad (5)$$

where F is a constant that is proportional to the amplitude of the applied oscillating magnetic field. The unitary transformation of a nuclear spin state is executed by applying an oscillating magnetic field in the form of a pulse. Thus, applying an oscillating magnetic field pulse having a pulse width $\Delta t$ gives a state after the application $|s\rangle = \alpha|0\rangle + \beta|1\rangle$, where it is transformed into:

$$|\alpha|^2 = \cos^2(2\pi F \Delta t) \quad (6)$$

$$|\beta|^2 = \sin^2(2\pi F \Delta t) \quad (7)$$

Figure 6:
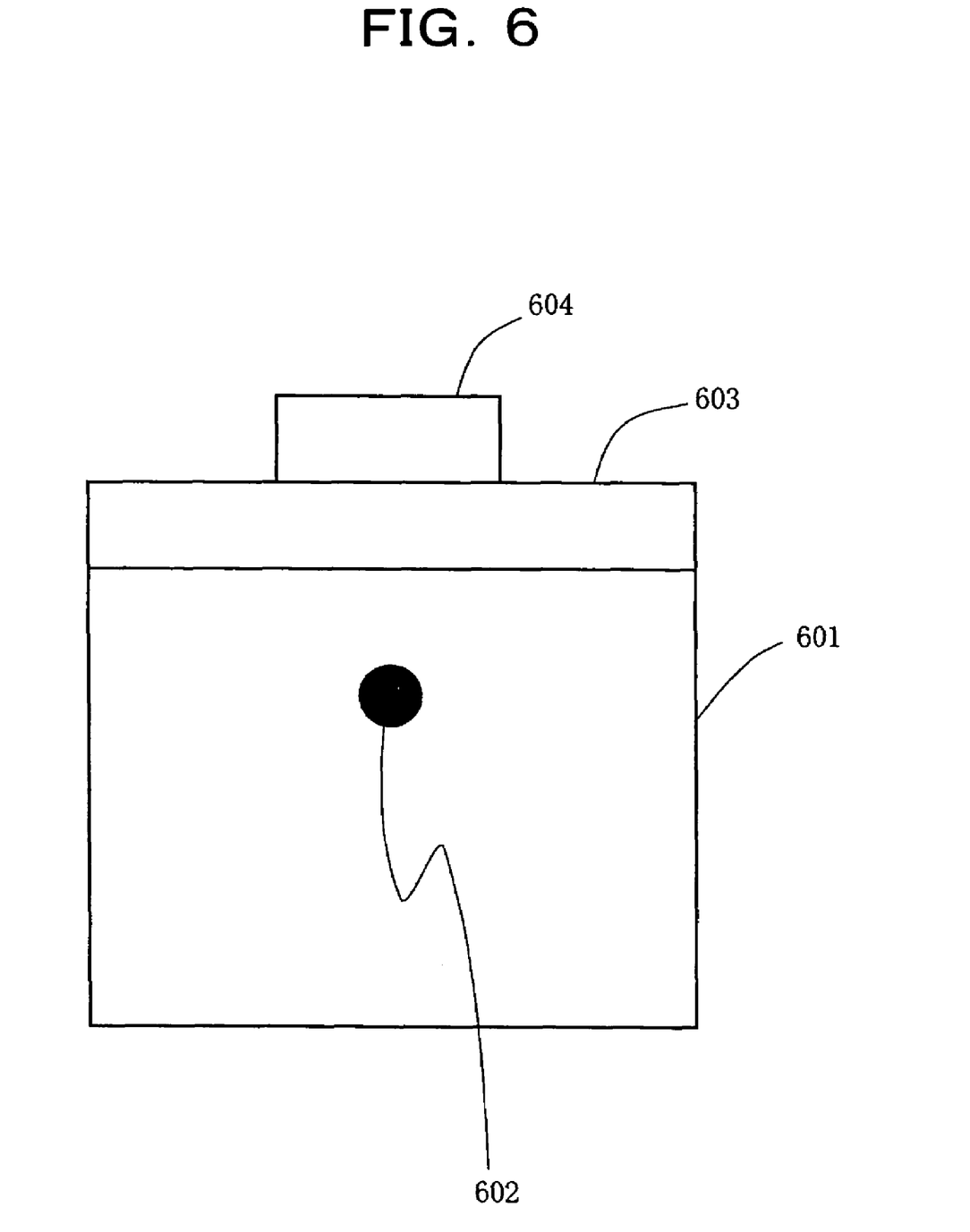
FIG. 6 is a conceptual view showing a typical prior in-solid nuclear spin processor device theoretically proposed and utilizing a single in-solid nuclear spin when controlled.

FIG. 6 is a conceptual view showing a typical in-solid nuclear spin processor device theoretically proposed and utilizing a single in-solid nuclear spin when controlled. See Nature, Vol. 393, p. 133 (1998).

In the example shown there, a structure having phosphor ($^{31}$P) 602 disposed in silicon 601 is provided with a metallic gate 604 via a barrier 603. With silicon ($^{28}$Si) having no nuclear spin, the nuclear spin with the quantum number of ½ which phosphor has functions as a quantum bit. Where silicon is tetravalent while phosphor is pentavalent, applying a bias voltage to the metallic gate 604 allows the extra charge which the phosphor possesses to be brought away from and near to the atomic nucleus. This in turn allows strengthening and weakening the hyperfine interaction between the electron spin and the nuclear spin. As a result, it is possible for the resonance frequency of nuclear magnetic resonance being described below to be controlled with a gate voltage. Further, although not shown, arranging a number of such structures adjacent one to next in a row allows forming a number of such quantum bits and connecting them together.

In this prior theoretical proposal of an in-solid nuclear spin processor device, NMR is brought about by a pulsed radiofrequency magnetic field to control the nuclear spin state |s> whereby the operation of its unitary transformation is effected as mentioned above to process quantum bits.

In a quantum computer having a makeup as mentioned above, the need to make a device smaller in size while achieving a high speed of its operation imposes the requirement on the device that each state of each of nuclear spins which must be as smaller as possible therein be controlled and read out at even a higher speed. The abovementioned theoretical proposal involves problems such as the need to completely remove impurities out of a silicon crystal, a technique of implanting precisely at a given location therein with a $^{31}P$ ion and micromachining at a precision in the order of 0.05 micrometer, all of which appear to be impossible to solve by the existing semiconductor technologies.

Figure 7:
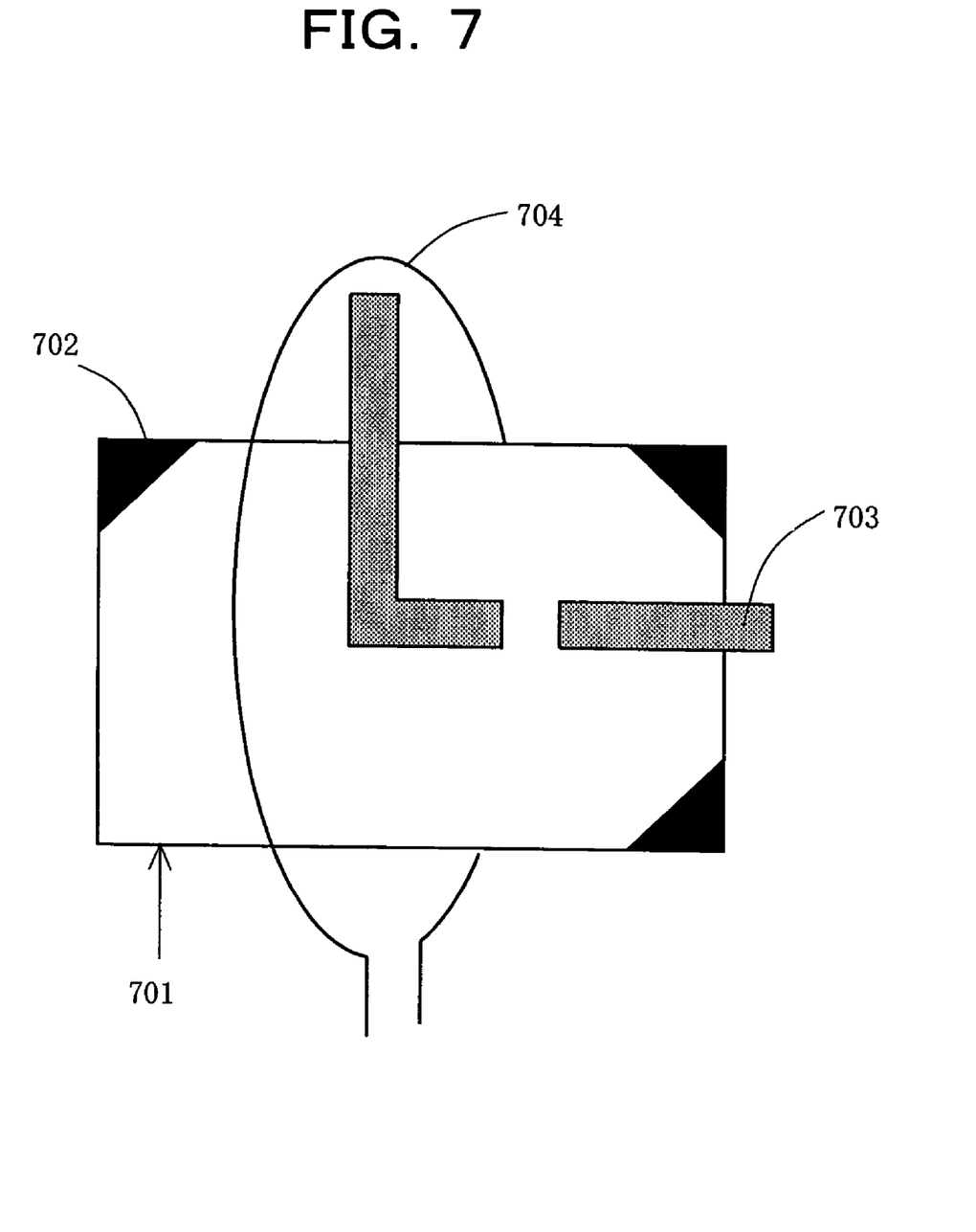
FIG. 7 is a conceptual view showing an exemplary prior device using a quantum Hall edge state achieved by a two dimensional electronic system in a semiconductor placed at a very low temperature and in a high magnetic field and wherein for a group of nuclear spins their polarization is read out.

On the other hand, FIG. 7 shows in a conceptual view an exemplary device using a quantum Hall edge state achieved by a two dimensional electronic system in a semiconductor placed at a very low temperature and in a high magnetic field and wherein for a group of nuclear spins their polarizations are read out. See Physical Review B, Vol. 56, p. 4743 (1997). In this example, a semiconductor hetero structure 701 is formed with electrodes 702 and a metallic gate 703. Passing a radiofrequency current through a coil 704 to impart a radiofrequency magnetic field modulation to the semiconductor hetero structure allows the nuclear spins to be detected.

In this device, however, the coil that generates the radiofrequency magnetic field to bring about nuclear magnetic resonance is several millimeters in diameter, much larger in size than a limited region in the order of several micrometers where the spin state (quantum bit) is to be detected. This may cause the entire two dimensional electronic system, the electrodes and the lead wires to be heated and the quantum Hall effect to collapse, preventing the nuclear spin from being controlled at high speed. The device has also the difficulty that the spin control has to be effected simultaneously for the nuclear spins existing in the entire two dimensional electronic system.

Thus, the prior in-solid nuclear spin quantum processor devices by theoretical proposals have been found either impossible to manufacture because of the need for a semiconductor microstructure that cannot be realized in the existing level of technologies or to fail to allow only a limited number of spins to be controlled and read out.

DISCLOSURE OF THE INVENTION

It is an object of the present invention to provide an in-solid nuclear spin quantum processor device which is rendered manufacturable and which is made to allow only a limited number of nuclear spins to be controlled, initialized, subjected to unitary transformation, and read out, by imparting a metallic microfine gate structure to a quantum Hall effect element that is realized by a two dimensional electronic system in a semiconductor.

In order to attain the object mentioned above, there is provided in accordance with the present invention an in-solid nuclear spin quantum processor device, characterized in that it comprises: an initializing means for initializing polarization of nuclear spins in a limited region of a semiconductor, by exploiting a quantum Hall edge state in a two-dimensional electronic system created in the semiconductor under a high magnetic field; a control means for applying a bias voltage to adjust their NMR frequency and applying a pulsed radiofrequency electric or magnetic field to the nuclear spins to control their polarization and thereby to control their quantum-mechanical state of superposition; and a detecting means responsive to the Hall resistance that varies as a function of the controlled nuclear spin polarization for reading out the controlled quantum-mechanical state of superposition.

The said initializing means for initializing the nuclear spin polarization in the limited region is characterized in that it is responsive to a non-equilibrium distribution of electron spins in the said quantum Hall edge state which is produced by applying a voltage across gate electrodes in the said two-dimensional electronic system.

The said detecting means for reading out the controlled quantum-mechanical state of superposition is characterized in that it is responsive to a change in the Hall resistance which is brought about by a change in effective Zeeman splitting energy that occurs attendant upon the control of the nuclear spin polarization.

The said control means to adjust the NMR frequency and to control the quantum mechanical state of superposition is characterized in that it utilizes a radiofrequency waveguide disposed in an area spaced from an edge of the said two-dimensional system by a submicronic distance. The said radiofrequency waveguide may be a coplanar-type waveguide or a waveguide in the form of a strip.

According to the present invention, scattering of electron spins that is accompanied by their inversion between quantum Hall edge states realized in a two dimensional system in a semiconductor allows nuclear spins in a limited region to be inversed, thus to make a preparation of an initial state before a quantum bit is processed.

Also, according to the present invention, applying a bias voltage to the microfine radiofrequency waveguide mounted in a limited area in the vicinity of channel edges allows adjusting the NMR frequency for nuclear spins.

Further, according to the present invention, applying a radiofrequency electric field to the said microfine radiofrequency waveguide while applying a radiofrequency electric or magnetic field to nuclear spins in the limited region allows nuclear magnetic resonance to be brought about only in a small area that is necessary and the unitary transformation of a nuclear spin state to be effected there.

Also, according to the present invention, detecting the controlled nuclear spin polarization in the limited region in terms of a change in the Hall resistance brought about by a change in the effective Zeeman splitting energy attendant upon the control of the nuclear spin polarization allows a quantum bit processed to be read out.

Further, according to the present invention, while the nuclear spins controlled by all the operations mentioned above amount to $10^7$ to $10^8$ in number, they can be assumed to be jointly operated as a single bit because practically 100% of them are initialized and their interaction with the outside is small.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings.

BEST MODES FOR CARRYING OUT THE INVENTION

Hereinafter, the present invention will be described in detail with reference to certain suitable forms of implementation thereof illustrated in the drawing figures.

Figure 1:
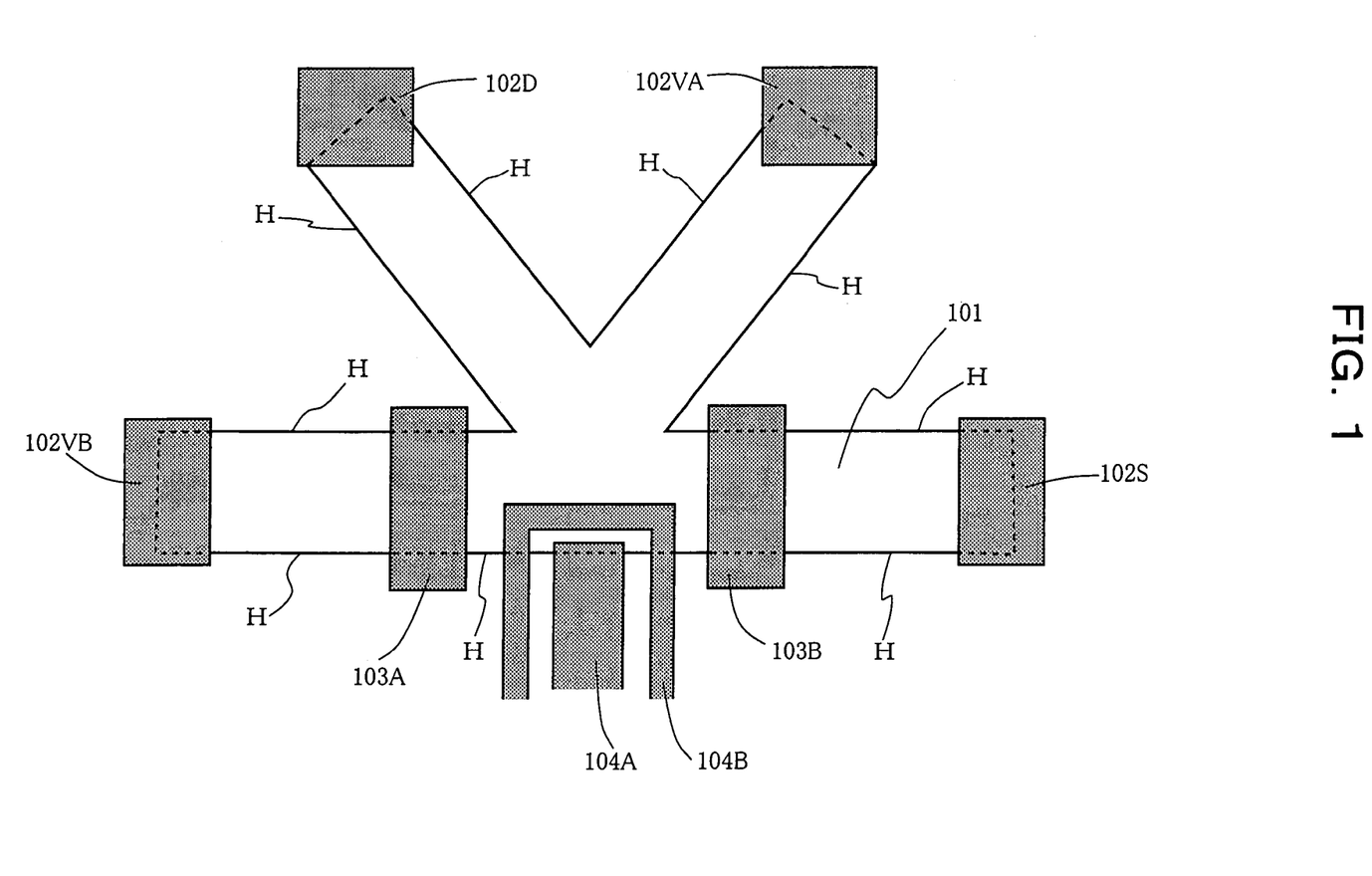
FIG. 1 is a plan view illustrating the makeup of a typical embodiment of the in-solid nuclear spin quantum processor device of the present invention.

FIG. 1 is a plan view illustrating the makeup of a typical embodiment of the in-solid nuclear spin quantum processor device of the present invention.

In the Figure there are shown a two dimensional electronic system 101 using solid material, ohmic electrodes 102S, 102D, 102VA and 102VB made of metal, Schottky gate electrodes 103A and 103B made of metal, a waveguide comprising a core wire 104 made of metal and a ground wire 104B made of metal, which are coplanar.

Figure 2:
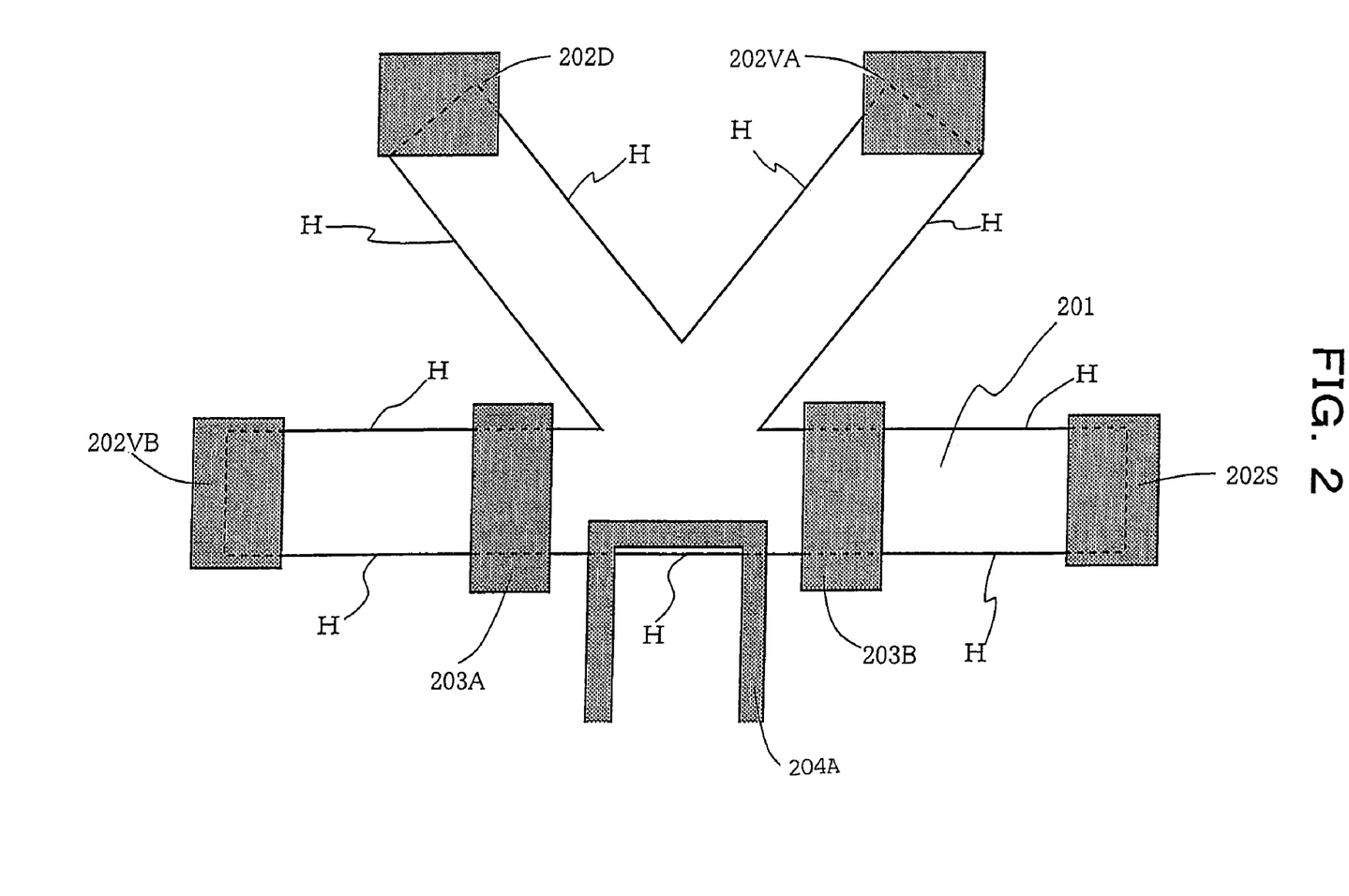
FIG. 2 is a plan view illustrating the makeup of another typical embodiment of the in-solid nuclear spin quantum processor device of the present invention.

The makeup of another embodiment of the present invention is shown in FIG. 2. In the Figure there are shown a two dimensional electronic system 201 using solid material, ohmic electrodes 202S, 202D, 202VA and 202VB made of metal, Schottky gate electrodes 203A and 203B made of metal, and a microstrip waveguide 204A made of metal.

The two dimensional electronic system 101, 102 using solid material may be formed by any known technique. For example, a GaAs substrate may be doped with impurity Al and thereby formed on it with a $Ga_xAl_{1-x}As$ (where $0<x<1$) epitaxial layer in a shape in conformity with that of the two dimensional electronic system 101, 201, which may then be covered with a cap layer made of GaAs or the like.

Mention is next made of an operation of the present quantum processor device.

Figure 3:
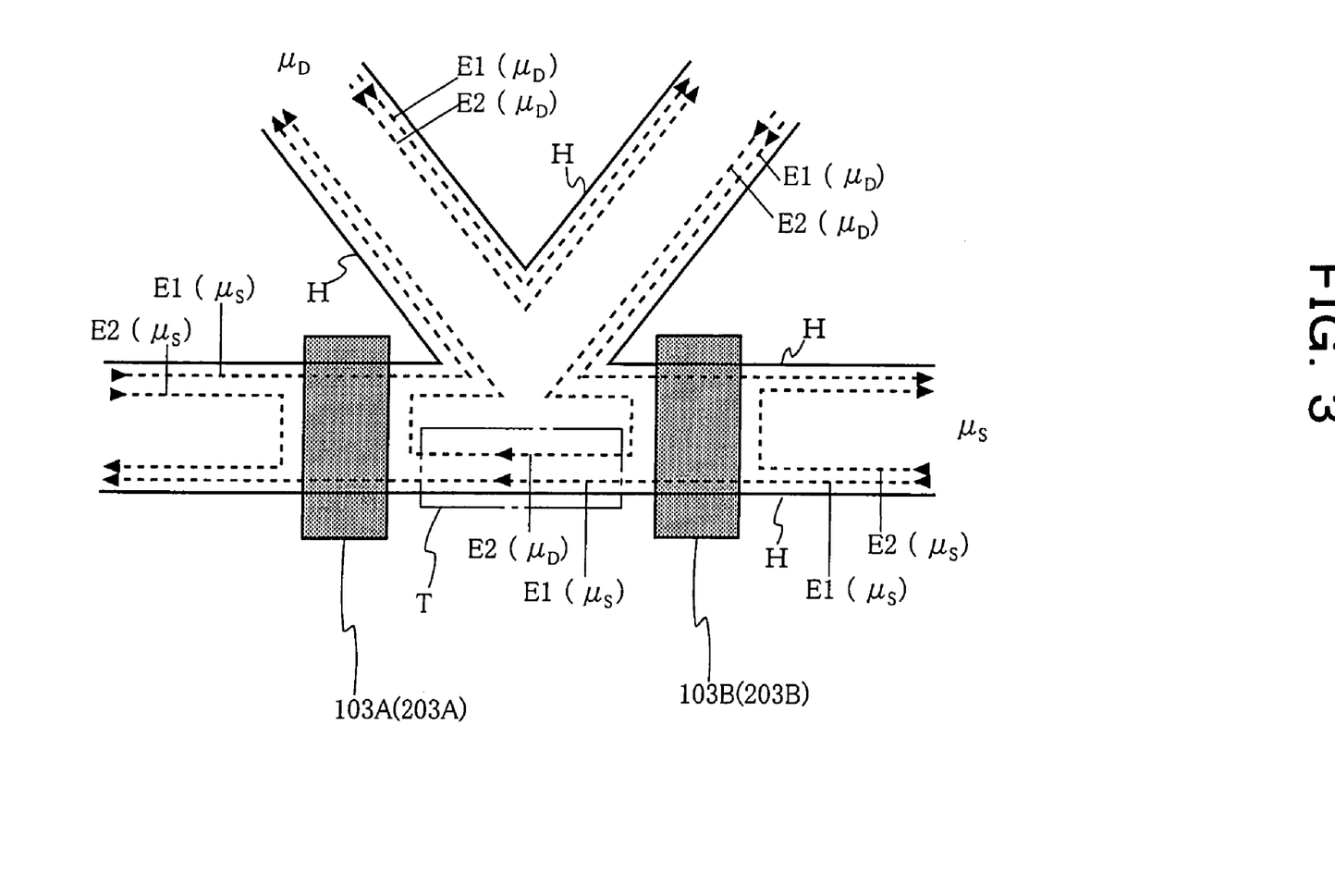
FIG. 3 is a diagrammatic view illustrating an operation of an in-solid nuclear spin quantum processor device of the present invention.

FIG. 3 is a diagrammatic view illustrating an operation of an in-solid nuclear spin quantum processor device of the present invention. For the sake of simplicity and clarity, in this Figure the ohmic electrodes in FIGS. 1 and 2 are omitted from designation.

The two dimensional electronic system 101 (or 102) is brought into a quantum Hall state by applying a magnetic field thereto in a direction perpendicular to the surface of the present quantum processor device, namely here perpendicular to the plane of sheet of paper for this drawing Figure. Here, the magnetic field is adjusted so that a state reached is a state in which the Landau level filling factor is 2. To wit, only those states with spins of the lowest Landau level oriented upwards and downwards are filled with electrons. In this case, two edge channels E1 and E2 with spins oriented upwards and downwards, respectively, are formed at an edge H of the two dimensional electronic system as shown in FIG. 3. Here, an edge channel is a pseudo-one dimensional electronic state that is produced when the Landau level energy rises at an edge H of the two dimensional electronic system and then crosses with the Fermi energy, and that acts as a one dimensional electron waveguide that bears electrical conduction in a magnetic field. Classically, it corresponds to an electron skipping orbit.

Here, a negative voltage is applied to the Schottky electrodes 103A and 103B (or 203A and 203B) at a voltage value such that the Landau level filling factor in each of areas beneath them becomes 1. In this case, as indicated by the broken lines in FIG. 3 the outer edge channel E1 (with the spin oriented upwards) passes through potential barriers formed by the Schottky electrodes 103A and 103B (or 203A and 203B) but the inner edge channel E2 (with the spin oriented downwards) is reflected by the potential barriers.

Thus, referring also to FIGS. 1 and 2, if the lower right hand ohmic electrode 102S (or 202s) and the upper left hand ohmic electrode 102D (or 202D) are biased to electrochemical potentials $\mu_s$ and $\mu_D$, respectively, to pass an electric current between them, then a state is achieved that in a region T surrounded with a (long dashed) dotted line in FIG. 3, the edge channel E1 with the spin oriented upwards is packed with electrons up to $\mu_s$ and the edge channel E2 with the spin oriented downwards is packed with electrons up to $\mu_D$. This is referred to as non-equilibrium distribution between edge channels. See Physical Review B, Vol. 40, p. 12566 (1989).

Here, if $\mu_s$ is larger than $\mu_D$, an electron with its spin inversed or flipping tunnels from the outer channel E1 into the inner channel E2, and in an area along the edge channels in the region T surrounded with the long dashed dotted line in FIG. 3 the inversion or flip process of electron spin from upwards to downwards is brought about continuously. The inversion or flip process of electron spin causes the opposite inversion or flop of nuclear spin. See Physical Review B, Vol. 56, p. 4743 (1997). Then, with the electron spin inversed downwards from upwards, the nuclear spin is inversed from downwards to upwards. As a result, a positive polarization of the nuclear spin occurs. On the other hand, if $\mu_s$ is smaller than $\mu_D$, an electron with its spin inversed or flipping tunnels from the inner channel E2 into the outer channel E1, and the inversion or flip process of electron spin from downwards to upwards is brought about continuously. Then, with the electron spin inversed upwards from downwards, the nuclear spin is inversed from upwards to downwards. As a result, a negative polarization of the nuclear spin occurs. Since the relative magnitudes of $\mu_s$ and $\mu_D$ are determined by the polarity of an electric current passed between the ohmic electrodes 102D and 102S (or 202D and 202S), selecting this current polarity allows determining the direction in which the nuclear spin polarization is to occur, namely to initialize the nuclear spin polarization prior to quantum bit processing.

In the GaxAl1-xAs/GaAs system used for the two dimensional electronic system, initialized states can be established in which nuclear spins of both Ga and As whose nuclear spin moment is ½are polarized upwards or downwards.

Mention is next made of the unitary transformation for the present quantum processor device. Here, an example is taken of the system having a nuclear spin moment of ½whose initialized state is the state that all the nuclear spins is oriented upwards, namely a positive nuclear spin polarization state.

A pulsed oscillatory electric field having a NMR frequency is applied to a pair of coplanar micro-waveguides 104A and 104B or a microstrip 204 mounted in the vicinity of the edge H of the two dimensional electronic system. In the embodiment shown in FIG. 1, applying the pulsed oscillatory electric field having the NMR frequency to the coplanar waveguide core and ground wires 104A and 104B causes the nuclear spins in the region between these wires 104A and 104B to be electrically modulated in direction perpendicular to the static magnetic field. In the embodiment shown in FIG. 2, applying the pulsed oscillatory electric field having the NMR frequency to the microstrip waveguide 204 causes the nuclear spins directly beneath the microstrip wave guide 204 to be magnetically modulated in direction perpendicular to the static magnetic field. Regardless of whether the field modulation is magnetic or electric, nuclear magnetic resonance is brought about in which the oscillation frequency coincides with the nuclear magnetic resonance frequency. See Physical Review B, Vol. 64, 195304 (2001).

Also, with the radiofrequency waveguide disposed within an area spaced from the two-dimensional system edge H by a submicronic distance, only those nuclear spins within a limited region spaced from the two-dimensional system edge H by a submicronic distance are electrically or magnetically modulated while the nuclear spins in the other regions of the two-dimensional system 101 (or 201) remain unmodulated electrically or magnetically.

Further, adjusting the bias voltage applied to the coplanar waveguide core and ground wires 104A and 104B permits changing the hyperfine interaction between the nuclear spin and electron systems (See Nature, Vol. 393, p. 133 (1998) and hence allows determining the NMR frequency as desired. Likewise, an adjustable bias voltage may be applied between the microstrip waveguide 204 and the substrate to determine the NMR frequency as desired.

Placed under the pulsed electric or magnetic field of a NMR frequency and with a pulse duration $\Delta t$, a nuclear spin initially oriented upwards evolves with time towards the state that it is oriented downwards. Controlling the time duration $\Delta t$ allows establishing a desired state of nuclear spin orientation, namely a desired state of superposition of upwardly and downwardly oriented nuclear spin states. This corresponds to controlling polarization of nuclear spins, thereby controlling their quantum-mechanical state of superimposition, and to processing one quantum bit.

Mention is next made of how the result of processing a quantum bit is read out.

Interaction between a nuclear spin system and an electron system causes the effective Zeeman splitting energy to vary. See Physical Review B, Vol. 56, p. 4743 (1997). In the presence of a positive nuclear spin polarization, the effective Zeeman splitting energy of an electron decreases, decreasing the distances between the edge channels E1 and E2 and thereby accelerating the tunneling between them. On the other hand, in the presence of a negative nuclear spin polarization, the effective Zeeman splitting energy of an electron increases, increasing the distances between the edge channels E1 and E2 and thereby decelerating the tunneling between them. To wit, the Zeeman splitting energy changes depending upon a direction of the nuclear spin polarization after a quantum bit is processed, and the tunneling probability between the edge channels changes as a result.

A change in the tunneling probability between the edge channels brings about a deviation of the Hall resistance from the quantized Hall resistance. See Physical Review B, Vol. 40, p. 12566 (1989). After the quantum bit is processed, a voltage may be applied across the ohmic electrodes 102VA and 102VB (or 202VA and 202VB) to pass an electric current between them, and a Hall resistance derived from the voltage and current. From a value of the Hall resistance it is possible to know a nuclear spin polarization after a quantum bit is processed and thus to read out a quantum bit processing result.

Further, with a quantum processor device of the present invention acting as a quantum bit, a plurality of such quantum processor devices may be arranged in a row so that any two of them are interacted via a hyperfine interaction between a nuclear spin and electron system of each of the two quantum bits. This makes it possible to process quantum bits over multiple bits. Furthermore, making each of these quantum processing operations a conditional state control operation leads to a quantum computer.

It should be noted here that the present invention is not to exclude an in-solid nuclear spin quantum processor device that operates at any other Landau level filling rate Also, while an example is taken above of a system in which the nuclear spin moment is ½, the present invention is applicable to a system, too, having multiple levels such as with a nuclear spin moment of 3/2. Then, since degeneracy for levels can be relieved by their electric quadrupolar interaction, it is possible to process quantum bits likewise for any two specified levels.

Mention is next made of a specific example of the present invention.

A in-solid nuclear spin quantum processor device of the present invention having a structure as shown in FIG. 1 is fabricated using a $Ga_xAl_{1-x}As/GaAs$ hetero structure. The electrodes were made of gold/germanium vapor-deposited and then annealed in an argon atmosphere. The Schottky electrodes and the coplanar waveguide were made of gold and germanium vapor-deposited. The waveguide core and ground wires each had a thickness and had a spacing between them, of 2 microns.

A magnetic field was applied to the thus prepared quantum processor device in a direction perpendicular to its surface to bring the two dimensional electronic system 101 into a quantum Hall state having a Landau level filling rate of 2. And, a negative voltage was applied to the Schottky electrodes 103A and 103B so that the areas directly beneath them had a Landau level filling rate of 1. Then, a fixed electric current was passed between the ohmic electrodes 102D and 102S, and at the same time a Hall resistance between the ohmic electrodes 102VA and 102VB was measured.

Figure 4:
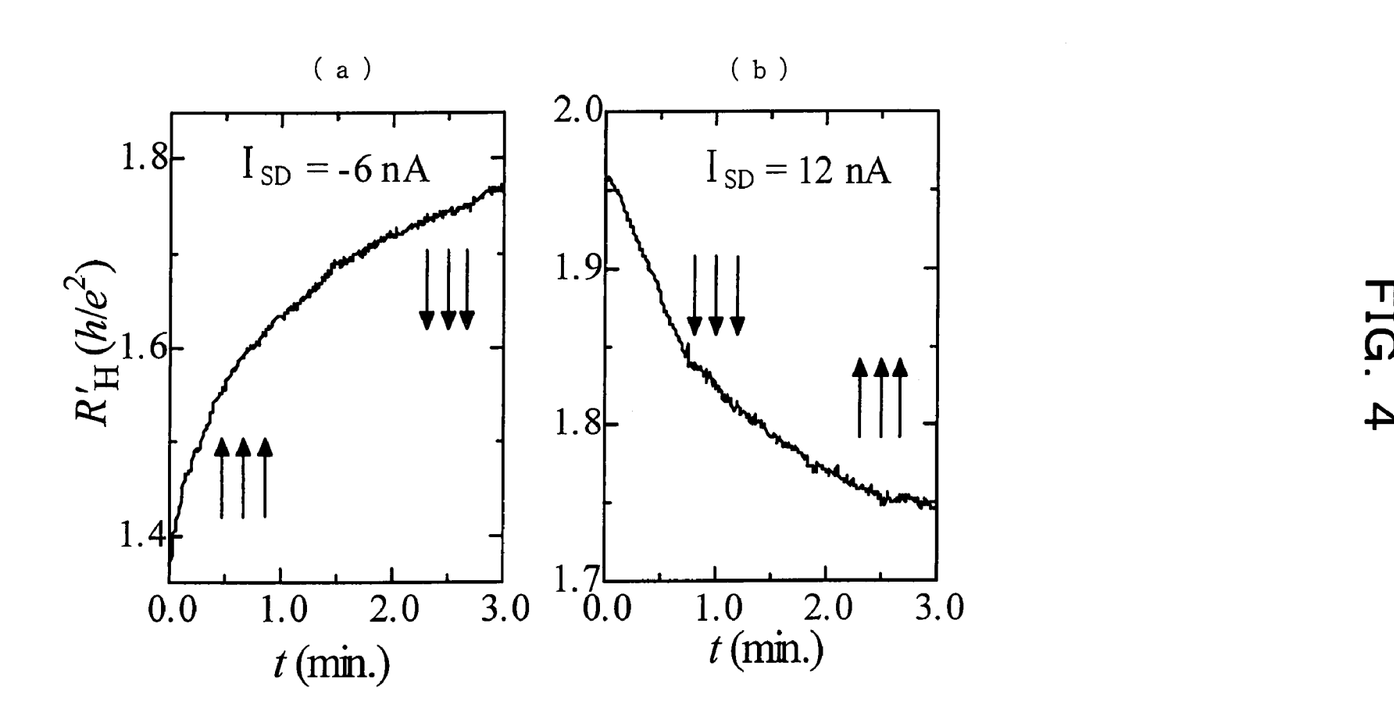
FIG. 4 show graphs of observational results illustrating how the initialization of a nuclear spin in an in-solid nuclear spin quantum processor device makes progress as observed as its Hall resistance changing with time.

FIG. 4 show graphs of observational results illustrating how the initialization of a nuclear spin in an in-solid nuclear spin quantum processor device makes progress as observed as its Hall resistance changing with time. FIG. 4(a) is a graph showing the change of Hall resistance with time when the specimen was initialized to a positive nuclear spin polarization, the electrochemical potential $\mu_D$ of the ohmic electrode 102D was set larger than the electrochemical potential $\mu_s$ of the ohmic electrode 102S and a fixed current $I_{DS}=-6nA$ was passed between them while the Hall resistance was measured. FIG. 4(b) is a graph showing the change of Hall resistance with time when the specimen was initialized to a negative nuclear spin polarization, the electrochemical potential $\mu_D$ of the ohmic electrode 102D was set smaller than the electrochemical potential $\mu_s$ of the ohmic electrode 102S and a fixed current $I_{DS}=12$ nA was passed between them while the Hall resistance was measured. In these graphs, the ordinate axis represents the Hall resistance and the abscissa axis represents the lapse of time from the point of time when the current began to flow, and the arrows indicate the directions of spin orientations.

From FIG. 4(a), it is seen that the Hall resistance increases as the time in which the fixed current $I_{DS}$ is flown elapses. This phenomenon indicates that as described in connection with FIG. 3, the inversion of electron spin orientation from downwards to upwards occurs continuously, which causes nuclear spin orientation to be inversed from upwards to downwards and thereby increases a negative nuclear spin polarization, the increase in the negative nuclear spin polarization increases the effective Zeeman splitting energy, the increase in the effective Zeeman splitting energy increases the distance between the edge channels, which decelerates the tunneling between the edge channels, eventually causing the Hall resistance to increase.

From FIG. (b), it is seen that the Hall resistance decreases as the time in which the fixed current $I_{DS}$ is flown elapses. This phenomenon indicates that as described in connection with FIG. 3, the inversion of electron spin orientation from upwards to downwards occurs continuously, which causes nuclear spin orientation to be inversed from downwards to upwards and thereby increases a positive nuclear spin polarization, the increase in the positive nuclear spin polarization decreases the effective Zeeman splitting energy, the decrease in the effective Zeeman splitting energy decreases the distance between the edge channels, which accelerates the tunneling between the edge channels, eventually causing the Hall resistance to decrease.

The results shown in FIG. 4 demonstrate the nuclear spin initializing function of an in-solid nuclear spin quantum processor device of the present invention as well as its function to read out its quantum processing result.

Mention is next made of a specific example that demonstrates a function of this in-solid nuclear spin quantum processor device according to the present invention to process a quantum bit. A radiofrequency electric field was applied to the microfine waveguide of coplanar wires 104A and 104B mounted in the vicinity of the two dimensional electronic system edge H while Hall resistance was measured.

Figure 5:
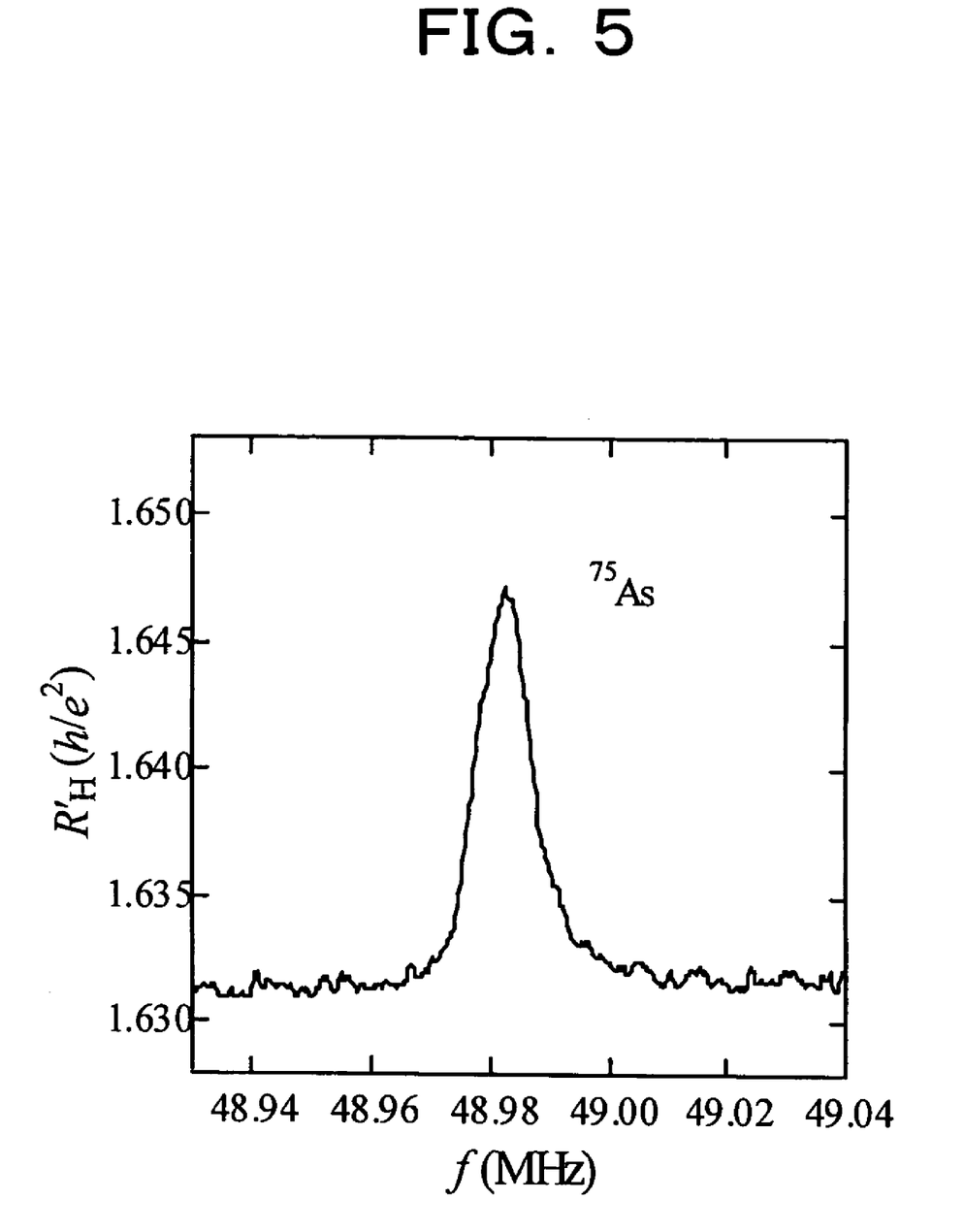
FIG. 5 is a graph of observational results illustrating how the polarization of a nuclear spin in an in-solid nuclear spin quantum processor device is controlled by a radiofrequency magnetic field as observed as its Hall resistance changing with time.

FIG. 5 is a graph of observational results illustrating how the polarization of a nuclear spin in an in-solid nuclear spin quantum processor device is controlled by a radiofrequency magnetic field as observed as its Hall resistance changing with time. The specimen was initialized to a positive nuclear spin polarization, and the frequency of the radiofrequency electric field applied was varied while changes in Hall resistance were measured. In the graph, the ordinate axis represents the Hall resistance and the abscissa axis represents the frequency of the radiofrequency electric field.

As is apparent from FIG. 5, a peak structure of the Hall resistance is observed around a frequency of 48.98 MHz, which is the nuclear magnetic resonance frequency of As. It is thus seen that nuclear magnetic resonance was brought about at a frequency coincident with the nuclear magnetic resonance frequency of As, causing the positive spin polarization to decrease and eventually causing the Hall resistance to increase. Therefore, controlling the time duration of the applied radiofrequency electric field allows the peak height of Hall resistance to be controlled as desired and thus the quantum-mechanical state of superposition to be controlled as desired. The results shown in FIG. 5 demonstrate the function of an in-solid nuclear spin quantum processor device according to the present invention to process a quantum bit.

Although the present invention has hereinbefore been set forth with respect to certain illustrative embodiments thereof, it will readily be appreciated to be obvious to those skilled in the art that many alterations thereof, omissions therefrom and additions thereto can be made without departing from the essences of scope of the present invention. Accordingly, it should be understood that the invention is not intended to be limited to the specific embodiments thereof set forth above, but to include all possible embodiments that can be made within the scope with respect to the features specifically set forth in the appended claims and to encompass all the equivalents thereof.

INDUSTRIAL APPLICABILITY

It will be appreciated from the foregoing description that according to the present invention, the exploitation of a quantum Hall edge state in a two dimensional electronic system created under a magnetic field in a semiconductor material allows initializing polarization of nuclear spins in a limited region of the semiconductor. Also, providing a waveguide in a limited area in the vicinity of an edge of the two dimensional electronic system allows controlling the polarization of nuclear spins in the limited region and thereby controlling their state of superposition. Further, detecting the Hall resistance that varies as a function of the nuclear spin polarization allows the quantum-mechanical state of superposition to be read out. Accordingly, using such in-solid nuclear spin quantum processor devices of the present invention makes it possible to build a practical solid-state quantum computer therefrom.

What is claimed is:

1. An in-solid nuclear spin quantum processor device, comprising:
   an initializing means for initializing polarization of nuclear spins in a limited region of a semiconductor, by exploiting a quantum Hall edge state in a two-dimensional electronic system created in the semiconductor under a high magnetic field;
   a control means for applying a bias voltage to adjust their NMR frequency and applying a pulsed radiofrequency electric or magnetic field to the nuclear spins to control their polarization and thereby to control their quantum-mechanical state of superposition; and
   a detecting means responsive to the Hall resistance that varies as a function of the controlled nuclear spin polarization for reading out the controlled quantum-mechanical state of superposition;
   wherein said initializing means is responsive to a non-equilibrium distribution of electron spins in said quantum Hall edge state which is produced by applying a voltage across gate electrodes in said two-dimensional electronic system.

2. An in-solid nuclear spin quantum processor device comprising:
- an initializing means for initializing polarization of nuclear spins in a limited region of a semiconductor, by exploiting a quantum Hall edge state in a two-dimensional electronic system created in the semiconductor under a high magnetic field;
- a control means for applying a bias voltage to adjust their NMR frequency and applying a pulsed radiofrequency electric or magnetic field to the nuclear spins to control their polarization and thereby to control their quantum-mechanical state of superposition; and
- a detecting means responsive to the Hall resistance that varies as a function of the controlled nuclear spin polarization for reading out the controlled quantum-mechanical state of superposition, wherein said detecting means is responsive to a change in the Hall resistance which is brought about by a change in effective Zeeman splitting energy that occurs attendant upon the control of the nuclear spin polarization.

3. An in-solid nuclear spin quantum processor device as set forth in claim 2, wherein said initializing means is responsive to a non-equilibrium distribution of electron spins in said quantum Hall edge state which is produced by applying a voltage across gate electrodes in said two-dimensional electronic system.

4. An in-solid nuclear spin quantum processor device as set forth in claim 2 or claim 3, wherein said control means utilizes a radiofrequency waveguide disposed in an area spaced from an edge of said two-dimensional system by a submicronic distance.

5. An in-solid nuclear spin quantum processor device as set forth in claim 4, wherein said radiofrequency waveguide is a coplanar-type waveguide.

6. An in-solid nuclear spin quantum processor device as set forth in claim 4, wherein said radiofrequency waveguide is a waveguide in the form of a strip.

7. An in-solid nuclear spin quantum processor device, comprising:
- an initializing means for initializing polarization of nuclear spins in a limited region of a semiconductor, by exploiting a quantum Hall edge state in a two-dimensional electronic system created in the semiconductor under a high magnetic field;
- a control means for applying a bias voltage to adjust their NMR frequency and applying a pulsed radiofrequency electric or magnetic field to the nuclear spins to control their polarization and thereby to control their quantum-mechanical state of superposition; and
- a detecting means responsive to the Hall resistance that varies as a function of the controlled nuclear spin polarization for reading out the controlled quantum-mechanical state of superposition;
- wherein said control means utilizes a radiofrequency waveguide disposed in an area spaced from an edge of said two-dimensional system by a submicronic distance.

8. An in-solid nuclear spin quantum processor device as set forth in claim 7, wherein said initializing means is responsive to a non-equilibrium distribution of electron spins in said quantum Hall edge state which is produced by applying a voltage across gate electrodes in said two-dimensional electronic system.

9. An in-solid nuclear spin quantum processor device as set forth in claim 7 or claim 8, wherein said radiofrequency waveguide is a coplanar-type waveguide.

10. An in-solid nuclear spin quantum processor device as set forth in claim 7 or claim 8, wherein said radiofrequency waveguide is a waveguide in the form of a strip.

* * * * *